(12) United States Patent
Minamio

(10) Patent No.: US 9,572,291 B2
(45) Date of Patent: Feb. 14, 2017

(54) SEMICONDUCTOR DEVICE AND METHOD FOR MANUFACTURING SAME

(71) Applicant: Panasonic Intellectual Property Management Co., Ltd., Osaka (JP)

(72) Inventor: Masanori Minamio, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 28 days.

(21) Appl. No.: 14/395,411

(22) PCT Filed: Apr. 26, 2013

(86) PCT No.: PCT/JP2013/002866
§ 371 (c)(1),
(2) Date: Oct. 17, 2014

(87) PCT Pub. No.: WO2013/175714
PCT Pub. Date: Nov. 28, 2013

(65) Prior Publication Data
US 2015/0116945 A1    Apr. 30, 2015

(30) Foreign Application Priority Data
May 22, 2012    (JP) .................................. 2012-116187

(51) Int. Cl.
*H05K 7/20*    (2006.01)
*H01L 23/40*    (2006.01)
(Continued)

(52) U.S. Cl.
CPC ............... *H05K 7/209* (2013.01); *H01L 21/02* (2013.01); *H01L 23/4006* (2013.01);
(Continued)

(58) Field of Classification Search
CPC .................. H01L 2224/45124; H01L 2924/00; H01L 2924/13055; H01L 25/18; H01L 25/07; H01L 25/162; H05K 7/209
(Continued)

(56) References Cited

U.S. PATENT DOCUMENTS 6,272,015 B1 *   8/2001   Mangtani ............. H05K 7/1432
                                                165/185
6,304,448 B1 *  10/2001   Fukada .................. H05K 7/209
                                                174/16.3
(Continued)

FOREIGN PATENT DOCUMENTS

JP         04-233752 A    8/1992
JP         09-045851 A    2/1997
(Continued)

OTHER PUBLICATIONS

Extended European Search Report dated Jul. 3, 2015 issued in European Patent Application No. 13793424.6.
(Continued)

*Primary Examiner* — Courtney Smith
*Assistant Examiner* — Matt Dhillon
(74) *Attorney, Agent, or Firm* — McDermott Will & Emery LLP

(57) ABSTRACT

A semiconductor device includes: a block module which internally includes a power semiconductor element and a first heatsink, and from which a main circuit terminal and a control terminal are drawn; a control substrate connected to the control terminal; a package in which the block module and the control substrate are housed; and a second heatsink to which the package is fixed by a connection screw. The connection screw is inserted into the second heatsink so as to be inclined at an inclination angle θ relative to a normal to a surface of the second heatsink.

15 Claims, 8 Drawing Sheets

(51) Int. Cl.
*H01L 23/433* (2006.01)
*H01L 23/495* (2006.01)
*H01L 25/16* (2006.01)
*H01L 25/07* (2006.01)
*H01L 25/18* (2006.01)
*H01L 21/02* (2006.01)
*H01L 25/10* (2006.01)
*H01L 23/373* (2006.01)

(52) U.S. Cl.
CPC .... *H01L 23/4334* (2013.01); *H01L 23/49555* (2013.01); *H01L 23/49575* (2013.01); *H01L 25/07* (2013.01); *H01L 25/162* (2013.01); *H01L 25/18* (2013.01); *H01L 23/3735* (2013.01); *H01L 25/105* (2013.01); *H01L 2224/45124* (2013.01); *H01L 2224/48091* (2013.01); *H01L 2224/48137* (2013.01); *H01L 2224/48139* (2013.01); *H01L 2224/48247* (2013.01); *H01L 2225/1029* (2013.01); *H01L 2924/1305* (2013.01); *H01L 2924/13055* (2013.01); *H01L 2924/181* (2013.01); *H01L 2924/30107* (2013.01); *Y10T 29/41* (2015.01)

(58) Field of Classification Search
USPC .......................................... 361/709; 29/25.01
See application file for complete search history.

(56) References Cited

U.S. PATENT DOCUMENTS

| | | | | |
|---|---|---|---|---|
| 6,313,598 | B1* | 11/2001 | Tamba | H01L 23/3107 257/692 |
| 6,509,629 | B2* | 1/2003 | Yoshimatsu | H01L 23/552 257/659 |
| 6,703,699 | B2* | 3/2004 | Kawaguchi | H01L 25/072 257/678 |
| 6,704,201 | B2* | 3/2004 | Kasuga | H01L 25/11 165/185 |
| 7,151,311 | B2* | 12/2006 | Nakajima | H01L 21/565 257/728 |
| 7,477,519 | B2* | 1/2009 | Kubo | H01L 23/04 165/104.33 |
| 7,498,701 | B2* | 3/2009 | Kikuchi | H02K 11/048 310/68 B |
| 7,766,943 | B1* | 8/2010 | Fallin | A61B 17/7085 606/264 |
| 7,812,487 | B2* | 10/2010 | Bi | H05K 7/20409 310/64 |
| 8,102,670 | B2* | 1/2012 | Sakamoto | H05K 1/144 361/792 |
| 8,107,255 | B2* | 1/2012 | Sakamoto | H05K 1/144 361/695 |
| 8,304,871 | B2* | 11/2012 | Yu | H01L 23/3107 257/675 |
| 8,506,600 | B2* | 8/2013 | Carbone | A61B 17/7034 606/266 |
| 8,710,705 | B2* | 4/2014 | Yamasaki | B62D 5/0406 310/68 B |
| 8,803,383 | B2* | 8/2014 | Miyachi | H02K 11/33 310/64 |
| 8,957,556 | B2* | 2/2015 | Yamasaki | H02K 5/225 310/68 D |
| 2003/0011054 | A1* | 1/2003 | Jeun | H01L 21/565 257/678 |
| 2003/0183907 | A1* | 10/2003 | Hayashi | H01L 21/565 257/666 |
| 2003/0197255 | A1 | 10/2003 | Nakajima et al. | |
| 2008/0157112 | A1* | 7/2008 | He | F21V 23/002 257/98 |
| 2010/0026185 | A1* | 2/2010 | Betsuda | F21K 9/135 315/32 |
| 2012/0250335 | A1* | 10/2012 | Nakano | F21V 29/02 362/382 |
| 2012/0286605 | A1* | 11/2012 | Miyachi | B62D 5/0406 310/71 |
| 2013/0277820 | A1* | 10/2013 | Hotta | H01L 23/4006 257/712 |

FOREIGN PATENT DOCUMENTS

| | | |
|---|---|---|
| JP | H09-045851 A | 2/1997 |
| JP | 2003-243609 A | 8/2003 |
| JP | 2009-099339 A | 5/2009 |

OTHER PUBLICATIONS

International Search Report issued in PCT/JP2013/002866, dated Jul. 16, 2013, with English translation.

* cited by examiner

SEMICONDUCTOR DEVICE AND METHOD FOR MANUFACTURING SAME

RELATED APPLICATIONS

This application is the U.S. National Phase under 35 U.S.C. §371 of International Application No. PCT/JP2013/002866, filed on Apr. 26, 2013, which in turn claims the benefit of Japanese Application No. 2012-116187, filed on May 22, 2012, the disclosures of which Applications are incorporated by reference herein.

TECHNICAL FIELD

The present disclosure relates to semiconductor devices and methods for fabricating the same.

BACKGROUND ART

Examples of semiconductor devices include power devices, such as switching elements. A power device is used, for example, in the form of a power conditioner of a photovoltaic power generation system, or is used to control the rotation of a motor. Module products each formed by housing a plurality of power devices in a block module are referred to as power modules.

For example, PATENT DOCUMENT 1 describes a conventional technique relating to power modules. FIG. 11 is a schematic cross-sectional view of a semiconductor device described in PATENT DOCUMENT 1.

As illustrated in FIG. 11, the semiconductor device according to PATENT DOCUMENT 1 includes a metal plate 103 containing copper (Cu) as the main ingredient, and an outer case 102 insert-molded together with a metal terminal 101. The metal plate 103 is fixed on a lower surface of the outer case 102 with an adhesive 104. An insulative substrate 105 having an interconnect pattern is joined onto the metal plate 103 with solder 106. A plurality of power semiconductor elements 107 including an insulated gate bipolar transistor (IGBT) and a freewheel diode are joined onto the insulative substrate 105 with solder (not shown). Electrodes (not shown) each formed on the surface of a corresponding one of the power semiconductor elements 107 and relay terminals 108 of the outer case 102 are connected together through an aluminum (Al) wire 109. A control substrate 112 is placed immediately above the power semiconductor elements 107. A control element 110 and passive components 111, such as a capacitor and a resistor, are mounted on the control substrate 112. The control element 110 controls the power semiconductor elements 107. The relay terminals 108 are inserted into the control substrate 112 to electrically connect the power semiconductor elements 107 to the control element 110. A region surrounding the power semiconductor elements 107 (the internal space of the outer case 102 between the metal plate 103 and the control substrate 112) is encapsulated with a resin material, such as a silicone gel 113, to protect the power semiconductor elements 107 from the external environment.

Furthermore, PATENT DOCUMENT 2 describes a configuration in which a bottom plate of a package extends beyond a package body toward an area surrounding the package body, and a portion of the bottom plate extending beyond the package body is secured onto a base by screws.

CITATION LIST

Patent Documents

PATENT DOCUMENT 1: Japanese Unexamined Patent Publication No. 2003-243609
PATENT DOCUMENT 2: Japanese Unexamined Patent Publication No. H04-233752

SUMMARY OF THE INVENTION

Technical Problem

Unfortunately, if the amount of heat dissipated from a lower surface of the semiconductor device described in PATENT DOCUMENT 1 is inadequate, heat may be transferred through the silicone gel 113 to the control substrate 112, and the reliability of each of the control substrate 112 and the control element 110 may be reduced. The reason for this is that while the reliability of the power semiconductor elements 107 is not problematic in a situation where the typical power semiconductor elements 107 generate heat to 150° C., the control substrate 112 and the control element 110 may be less resistant to heat than the power semiconductor elements 107.

Furthermore, in the semiconductor device described in PATENT DOCUMENT 1, if the semiconductor device including the warped metal plate 103 is placed on a heatsink, the degree of contact between the semiconductor device and the heatsink may be reduced, and heat dissipation may be locally reduced.

It is therefore an object of the present disclosure to achieve a semiconductor device that reduces the transfer of excessive heat from power semiconductor elements to a control substrate and has a high degree of contact with, for example, a heatsink, and a method for fabricating the same.

Solution to the Problem

In order to achieve the object, a semiconductor device according to the present disclosure includes: a block module which internally includes a power semiconductor element and a first heatsink, and from which a main circuit terminal and a control terminal are drawn; a control substrate connected to the control terminal; a package in which the block module and the control substrate are housed; and a second heatsink to which the package is fixed by a connection screw. The connection screw is inserted into the second heatsink so as to be inclined at an inclination angle $\theta$ relative to a normal to a surface of the second heatsink.

Furthermore, in order to achieve the object, a semiconductor device includes: a block module which internally includes a power semiconductor element and a first heatsink, and from which a main circuit terminal and a control terminal are drawn; a control substrate connected to the control terminal; a package in which the block module and the control substrate are housed; and a second heatsink to which the package is fixed. When the first and second heatsinks are arranged in parallel, a surface of the package is inclined at an inclination angle $\theta$ relative to a surface of the second heatsink in a situation where the package is not fixed to the second heatsink, and the surface of the package is parallel to the surface of the second heatsink in a situation where the package is fixed to the second heatsink.

Furthermore, in order to achieve the object, a method for fabricating a semiconductor device according to the present disclosure includes: preparing a block module which internally includes a power semiconductor element and a first heatsink, and from which a main circuit terminal and a control terminal are drawn, a control substrate connected to the control terminal, and a package in which the block module and the control substrate are housed and which includes a connection terminal joined to the main circuit terminal; and fixing the package having a surface inclined at an inclination angle θ to a second heatsink by a connection screw inserted into the second heatsink at the inclination angle θ relative to a normal to a surface of the second heatsink.

Advantages of the Invention

The present disclosure can provide a semiconductor device that reduces the transfer of excessive heat from power semiconductor elements to a control substrate and has a high degree of contact with, for example, a heatsink, and a method for fabricating the same.

DESCRIPTION OF EMBODIMENTS

Figure 1:
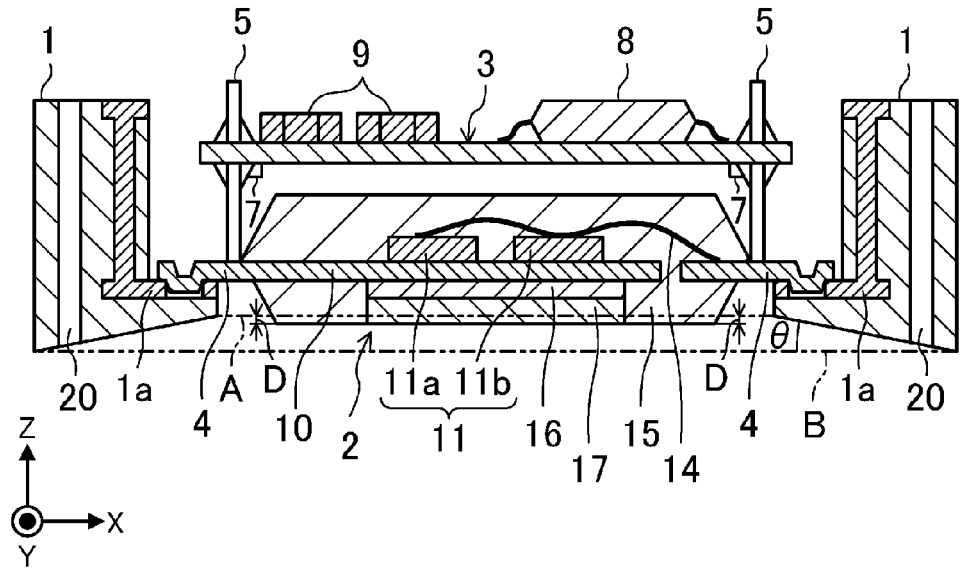
FIG. 1 is a schematic cross-sectional view illustrating a principal portion of a semiconductor device according to a first embodiment before the semiconductor device is placed on a second heatsink.

Embodiments of the present disclosure will now be described with reference to the drawings. While, in the following description, a semiconductor device including an IGBT as a switching element will be described, an element of the present disclosure should not be limited to the IGBT.

In the following description, like reference characters are used to designate identical elements, and explanation thereof is appropriately omitted. In the drawings, an X axis, a Y axis, and a Z axis are illustrated as necessary.

(First Embodiment)

FIG. 1 is a schematic cross-sectional view of a semiconductor device according to a first embodiment of the present disclosure.

As illustrated in FIG. 1, the semiconductor device according to the first embodiment includes an outer case 1, a block module 2 incorporated into the outer case 1, and a control substrate 3 placed immediately above the block module 2. While FIG. 1 illustrates a situation in which the single block module 2 is incorporated into the outer case 1, the semiconductor device according to this embodiment can include a plurality of block modules 2 incorporated into the outer case 1. A plurality of main circuit terminals 4 and a plurality of control terminals 5 are drawn from the block module 2. The outer case 1 is an example package.

The bottom surface of the outer case 1 is inclined upwardly (in a positive direction along the Z axis) at an inclination angle θ from the outer ends of the bottom surface of the outer case 1 (the lower ends of the outer case 1) toward the inner ends of the bottom surface. In other words, the bottom surface of the outer case 1 is inclined upwardly at an inclination angle θ from the outside of the outer case 1 (the outer periphery thereof) toward the interior of the outer case 1 (toward the block module 2). The bottom surface of the outer case 1 is an example surface of the outer case 1.

A feature of this embodiment is that the bottom surface of the outer case 1 into which the block module 2 is incorporated is inclined at such an inclination angle θ. Here, the bottom surface of the outer case 1 denotes a surface of the outer case 1 closer to the block module 2, i.e., a surface thereof at which a first heatsink 17 forming a portion of the block module 2 is exposed.

In this embodiment, when the bottom surface of the outer case 1 forms a hollow rectangle with four sides, two opposite ones of the four sides of the bottom surface of the outer case 1 are inclined at at least the inclination angle θ. Here, the reason why the two opposite sides of the bottom surface of the outer case 1 are inclined at at least the inclination angle θ is that when the outer case 1 is placed on a second heatsink 25 described below, the inward inclination of the outer case 1 enhances the degree of contact between the block module 2 and the second heatsink 25.

Furthermore, in this embodiment, the inclination angle θ at which the bottom surface of the outer case 1 is inclined is determined such that the height of the bottom surface of the block module 2 (the first heatsink 17) is lower than that of the inner ends of the bottom surface of the outer case 1. In other words, the inclination angle θ is determined such that a lower portion of the block module 2 protrudes in a negative direction along the Z axis beyond a virtual line A connecting opposite ones of the inner ends of the bottom surface of the outer case 1 together. Specifically, the virtual line A passes through the interior of the block module 2 (the first heatsink 17) in a situation where the outer case 1 is not fixed to the second heatsink 25 described below.

Here, when D represents the amount of a portion of the block module 2 protruding beyond the virtual line A (=the difference in height between the virtual line A and the bottom surface of the block module 2), the amount D is a positive value. The amount D is preferably determined such that the block module 2 is not beyond a virtual line B connecting the outer ends of the bottom surface of the outer case 1 (the lower ends of the outer case 1) together. If the amount D is determined such that the block module 2 is not beyond the virtual line B, the lower ends of the outer case 1 can protect a lower portion of the block module 2, for example, while the semiconductor device in the situation illustrated in FIG. 1 is carried.

The main circuit terminals 4 extend in lateral directions, i.e., in in-plane directions of the principal surface of a lead frame 10 (in positive and negative directions along the X axis), and are each connected to a corresponding one of outer case terminals 1a. In this embodiment, for ease of operation, each main circuit terminal 4 and the corresponding one of the outer case terminals 1a are electrically joined together by caulking. A caulking tool can be inserted into the main circuit terminals 4 to join each main circuit terminal 4 and the corresponding one of the outer case terminals 1a by caulking. Other examples of a process for electrically connecting the main circuit terminals 4 and the outer case terminals 1a together include soldering or screwing.

The control terminals 5 are drawn in a direction perpendicular to the main circuit terminals 4 (in a positive direction along the Z axis), and are connected to the control substrate 3. The control terminals 5 are each inserted through a corresponding one of through-holes (not shown) of the control substrate 3, and are electrically joined to the control substrate 3 by soldering, thereby connecting the control terminals 5 and the control substrate 3 together. The cross-sectional area of each control terminal 5 along a direction perpendicular to the major axis of the control terminal 5 is smaller than that of each main circuit terminal 4. The control terminals 5 each have a protrusion 7 under the control substrate 3, and the protrusions 7 support the control substrate 3.

For example, a control element 8 and passive components 9, such as a resistor and a capacitor, are mounted on the control substrate 3.

The lead frame 10 is placed inside the block module 2, and a plurality of power semiconductor elements 11 are placed on the lead frame 10. The power semiconductor elements 11 are each joined to a terminal of the lead frame 10 through an aluminum (Al) wire 14. The first heatsink 17 is located on a lower surface of the lead frame 10 with an insulating layer 16 interposed therebetween. A portion of the block module 2 except a portion of each of the main circuit terminals 4 and the control terminals 5 that is drawn outward is encapsulated with a resin material 15. Specifically, the block module 2 includes a portion of the lead frame 10, the power semiconductor elements 11, the insulating layer 16, and the first heatsink 17. A portion of the first heatsink 17 is exposed from the block module 2.

A plurality of first through holes 20 are formed in the outer case 1. In this embodiment, as described below, the first through holes 20 are utilized to secure the outer case 1 to the second heatsink 25 described below by screws, thereby bringing the first heatsink 17 into close contact with the second heatsink 25. The first through holes 20 are example screw through holes through which the outer case 1 is screwed.

Figure 2:
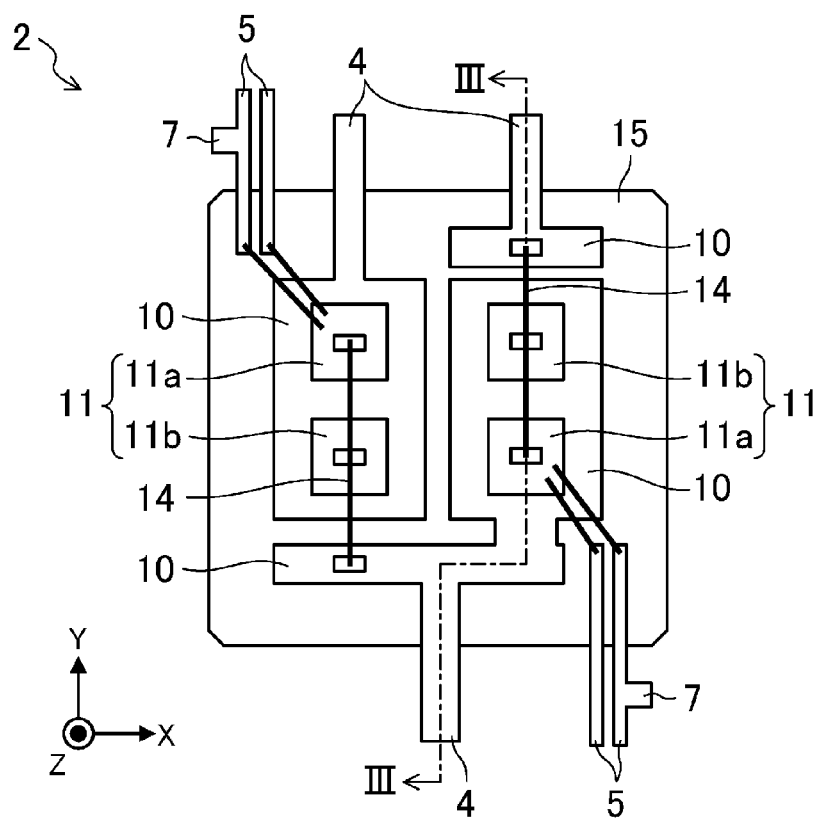
FIG. 2 is a schematic plan view illustrating the interior of a block module according to the first embodiment.
Figure 3:
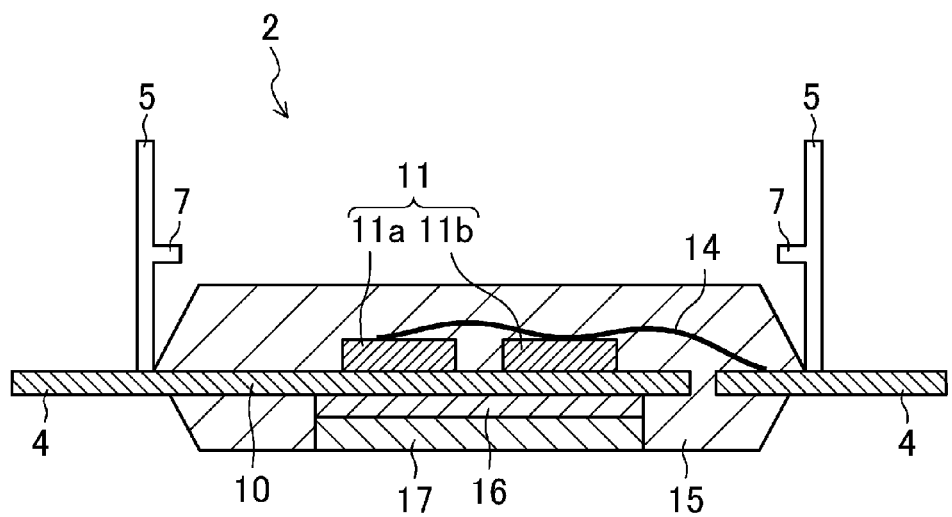
FIG. 3 is a schematic cross-sectional view taken along the line III-III in FIG. 2.
Figure 4:
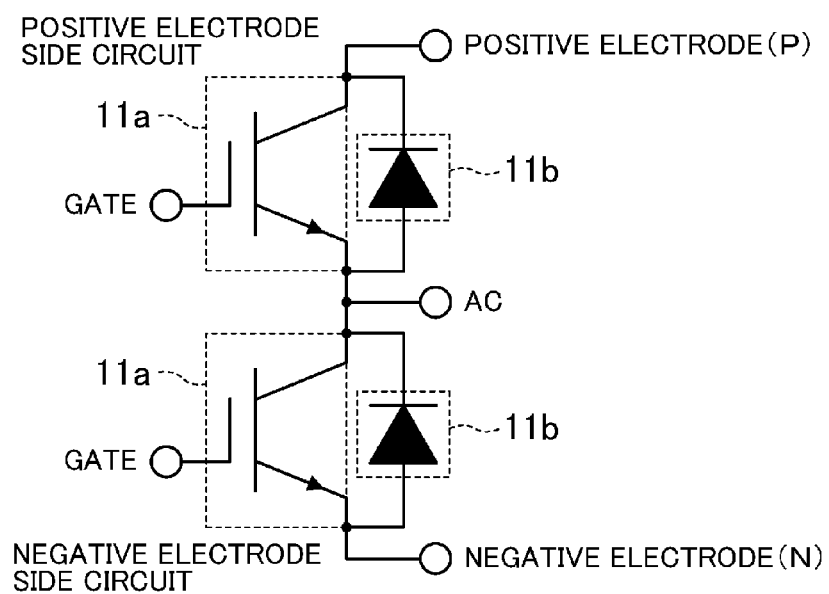
FIG. 4 is a circuit diagram illustrating the block module according to the first embodiment.

FIG. 2 is a schematic plan view of the interior of the block module 2 of this embodiment. FIG. 3 is a schematic cross-sectional view taken along the line III-III in FIG. 2. FIG. 4 illustrates an example circuit configuration of the block module 2 according to this embodiment. The internal structure and circuit configuration of the block module 2 should not be limited to the structure and configuration described in this embodiment.

As illustrated in FIG. 2, the power semiconductor elements 11 are placed on the lead frame 10 encapsulated with the resin material 15. The power semiconductor elements 11 each include, for example, an IGBT 11a and a diode 11b. The IGBT 11a and the diode 11b are placed in parallel on the lead frame 10. The power semiconductor elements 11 are joined to the lead frame 10 with a joining material (not shown). To increase heat dissipation, a metallic material having excellent thermal conductivity, such as Sn—Ag—Cu solder or sinterable Ag paste, is preferably used as the joining material. An aluminum (Al) wire having a diameter of about 150 µm, for example, can be used as the Al wire 14. The Al wire 14 does not need to be a wire, and may be a foil-like aluminum (Al) ribbon. For example, a thermosetting epoxy resin for transfer molding can be used as the resin material 15.

As illustrated in FIG. 3, the first heatsink 17 is placed on the lower surface of the lead frame 10 with the insulating layer 16 interposed therebetween. Heat generated from the power semiconductor elements 11 is dissipated outwardly through the first heatsink 17.

A circuit including the power semiconductor elements 11 generates a maximum voltage from several hundred volts to volts higher than 1000 V. Thus, for safety, the first heatsink 17 and the lead frame 10 need to be electrically insulated from each other. In this embodiment, the insulating layer 16 is provided between the first heatsink 17 and the lead frame 10. A resin material having both a heat-dissipation property and an insulation property is preferably used as the insulating layer 16. For example, to increase the heat dissipation of the resin material, the insulating layer 16 can include a filler having high thermal conductivity, such as alumina or boron nitride.

As illustrated in FIG. 4, the semiconductor device according to this embodiment includes, for example, two power semiconductor elements 11 connected in series, and is a single-phase inverter including a positive electrode terminal, a negative electrode terminal, and an AC terminal. The two power semiconductor elements 11 are placed on the lead frame 10, one of the power semiconductor elements 11 forms a positive electrode side circuit, and the other one thereof forms a negative electrode side circuit. The semiconductor device further includes gates each for switching a corresponding one of the circuits between on and off states. For example, a combination of three block modules 2 each having such a circuit configuration enables the formation of a three-phase alternating-current inverter circuit. The formation of the three-phase alternating-current inverter circuit enables the formation of a circuit that controls rotation of a motor.

Subsequently, a method for fabricating a semiconductor device according to this embodiment will be described with reference to FIGS. 5A-6C.

Figure 5A:
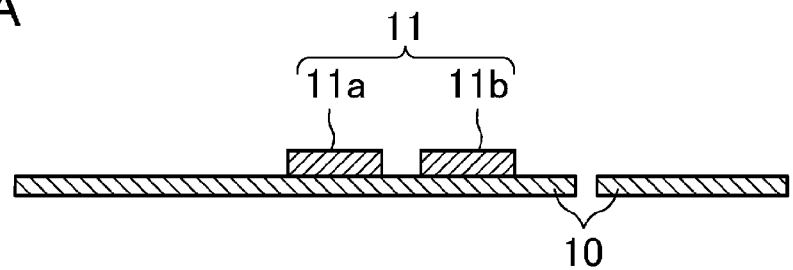
FIGS. 5A-5D are schematic cross-sectional views sequentially illustrating essential process steps in a method for fabricating a semiconductor device according to the first embodiment.

First, as illustrated in FIG. 5A, power semiconductor elements 11 are placed on a prepared lead frame 10. In this embodiment, as described above, IGBTs 11a and diodes 11b are placed on the lead frame 10, and each power semiconductor element 11 includes one of the IGBTs 11a and one of the diodes 11b. To increase heat dissipation, copper (Cu) having high thermal conductivity is preferably used as the material of the lead frame 10. Furthermore, a material having good thermal conductivity is preferably used as a material used to join the power semiconductor elements 11 to the lead frame 10.

Figure 5B:
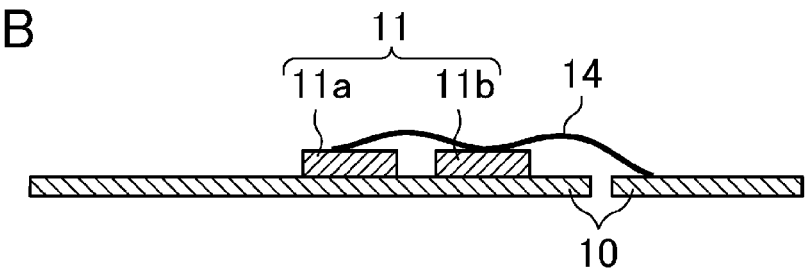

Next, as illustrated in FIG. 5B, top electrodes of each power semiconductor element 11 are electrically joined to the lead frame 10 through an Al wire 14. Here, each IGBT 11a and a corresponding one of the diodes 11b are connected in inverse parallel, and the Al wire 14 is connected to the lead frame 10. When ultrasonic joining is used to join the Al wire 14 to the lead frame 10, this permits joining at room temperature, and eliminates the need for a joining material. Thus, the Al wire 14 is preferably joined to the lead frame 10 by ultrasonic joining.

Figure 5C:
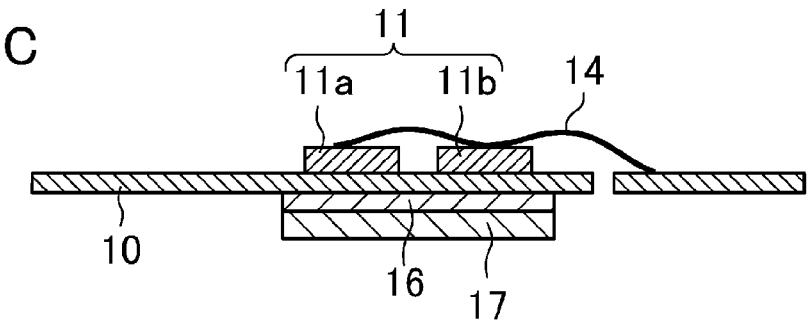

Next, as illustrated in FIG. 5C, a first heatsink 17 is adhered to a lower surface of the lead frame 10 with an insulating layer 16 interposed therebetween. The insulating layer 16 including an adhesive layer is previously adhered to the first heatsink 17, is formed into a desired shape, and is then adhered to the lead frame 10. When a thermosetting resin material is used in the form of the insulating layer 16, conditions, such as a temperature, need to be adjusted to prevent a loss of adhesiveness of the resin material arising from full curing of the resin material in an initial adhesion step because target objects to be adhered to the insulating layer 16 in this embodiment include two types of objects, i.e., the first heatsink 17 and the lead frame 10.

Figure 5D:
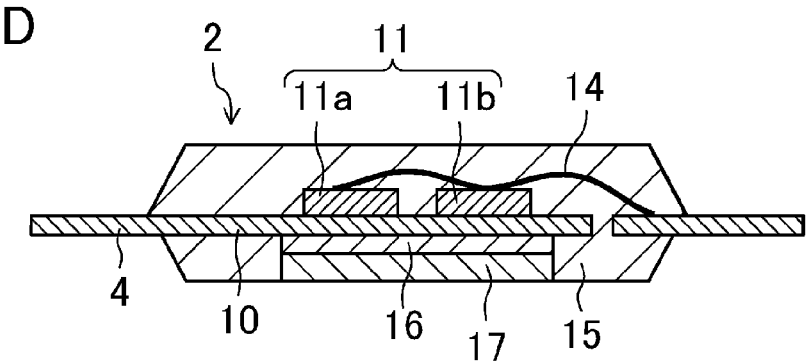

Next, as illustrated in FIG. 5D, a region of the lead frame 10 including the two power semiconductor elements 11 is encapsulated with a resin material 15 to fabricate a block module 2. In this case, examples of an encapsulation process include a transfer molding process in which a thermosetting epoxy resin serving as the resin material 15 is injected into an encapsulation die (not shown). In this process, the bottom surface of the first heatsink 17 is designed to contact the encapsulation die, and after encapsulation, the bottom surface of the first heatsink 17 is preferably exposed. The reason for this is that if the resin material 15 flows to the bottom surface of the first heatsink 17 during encapsulation to cover the bottom surface, a path through which heat is dissipated from the power semiconductor elements 11 is blocked to increase the thermal resistance.

Figure 6A:
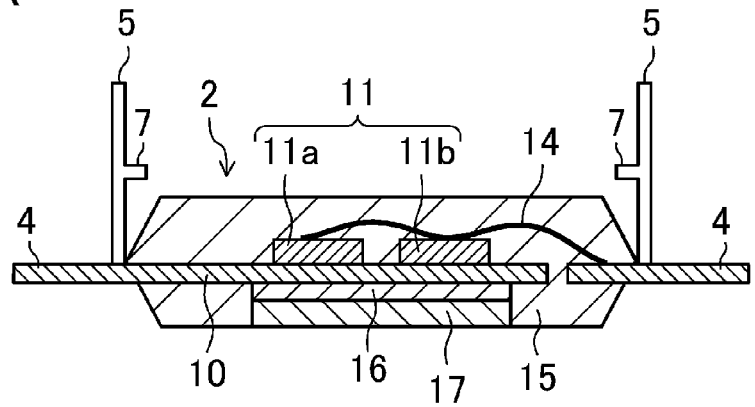
FIGS. 6A-6C are schematic cross-sectional views sequentially illustrating other essential process steps in the method for fabricating a semiconductor device according to the first embodiment.

Next, as illustrated in FIG. 6A, an unnecessary portion of the lead frame 10 is cut away, and a plurality of control terminals 5 are then preferably bent in a direction perpendicular to main circuit terminals 4. A block module 2 is first formed by performing this bending process. Each control terminal 5 of the formed block module 2 has already been formed with a protrusion 7.

Figure 6B:
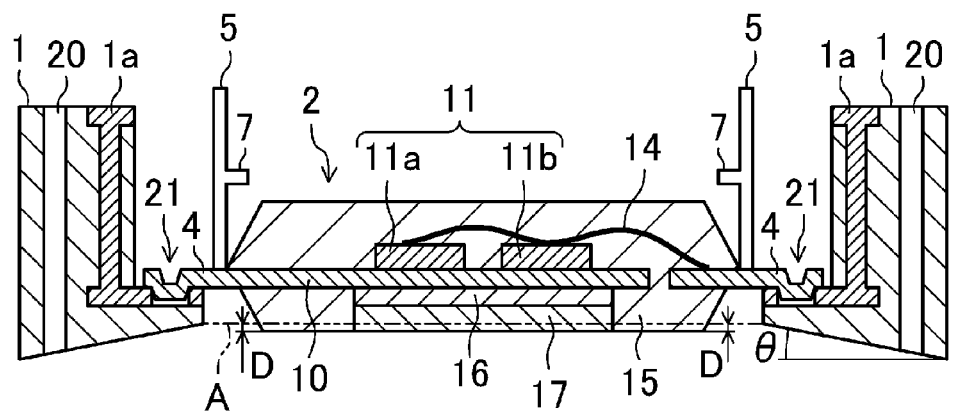

Next, as illustrated in FIG. 6B, the formed block module 2 is placed in an outer case 1. The bottom surface of the outer case 1 is inclined at the inclination angle θ described above. A feature of the present disclosure is that the bottom surface of the outer case 1 is inclined upwardly toward the interior of the outer case 1 at the inclination angle θ. The bottom surface of the outer case 1 inclined at the inclination angle θ provides advantages described below.

A plurality of block modules 2 can be placed in the outer case 1 along a lateral direction (along the Y axis in FIG. 1), and the number of the block modules 2 placed is determined by the circuit configuration of the semiconductor device. For this reason, the outer case 1 needs to include outer case terminals 1a each previously formed at a location corresponding to one of the main circuit terminals 4 of the block modules 2. As described above, for example, soldering, screwing, caulking, or ultrasonic joining can be used to join each main circuit terminal 4 and a corresponding one of the outer case terminals 1a together. Here, when a joining material is used for soldering or any other process, the difference in coefficient of thermal expansion between the joining material and the main circuit terminal 4 or the outer case terminal 1a may cause a break in the joining material. Mechanical fastening, such as screwing, increases the contact resistance between a screw and the main circuit terminal 4 or the outer case terminal 1a, and when a large current is passed through the semiconductor device, the resistance may cause a problem. For this reason, a process through which the terminals can be directly joined together, such as caulking or ultrasonic joining, is preferably selected to join the terminals. In this embodiment, caulking is selected, and the main circuit terminal 4 and the outer case terminal 1a are caulked with a caulking tool to form a caulked portion 21, thereby joining the main circuit terminal 4 and the outer case terminal 1a together.

Figure 6C:
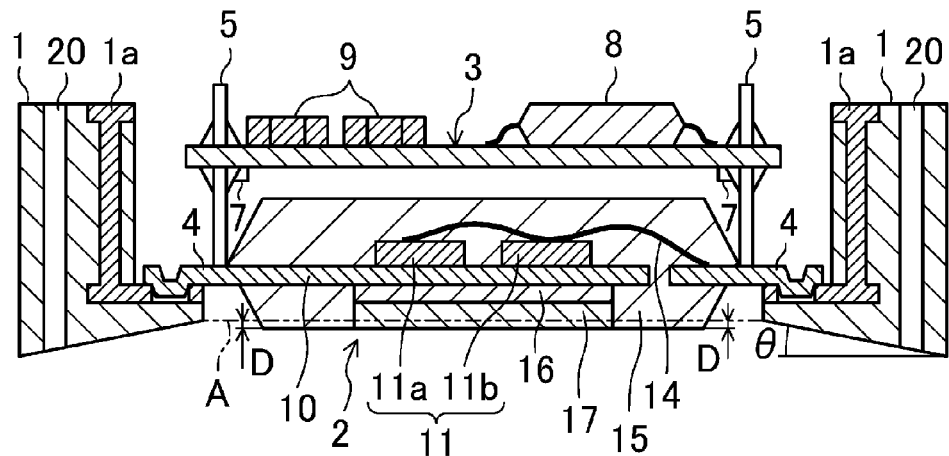

Next, as illustrated in FIG. 6C, the control terminals 5 of the block module 2 are inserted through through-holes of the control substrate 3 to electrically join the control substrate 3 and the block module 2 together. Here, since the control substrate 3 is supported by the protrusions 7 of the control terminals 5, the control substrate 3 can be fixed while the location of the control substrate 3 relative to the block module 2 is regulated. The semiconductor device according to this embodiment has a structure that regulates the location of the control substrate 3 as described above. This can reduce the heat transfer from the power semiconductor elements 11 to the control substrate 3, and can prevent the control substrate 3 and a control element 8 from being deteriorated or broken even when the temperature of each power semiconductor element 11 is high. When a distal end portion of each control terminal 5 is tapered, the control terminal 5 is easily inserted through a corresponding one of the through-holes of the control substrate 3.

Through-holes or cutouts may be formed in a peripheral portion of the control substrate 3, and a caulking tool may be inserted through each through-hole or each cutout to form a caulked portion 21. When the through-holes or the cutouts are formed in the control substrate 3, the outer case 1 is fixed to a second heatsink 25 while being inclined, and the control substrate 3 may be, therefore, warped by being caught in the outer case 1. For this reason, in particular, when the semiconductor device is to be reduced in size, the size of the control substrate 3 is preferably reduced such that the control substrate 3 is located inwardly from the locations at which the main circuit terminals 4 are caulked without forming through-holes or cutouts.

The semiconductor device according to this embodiment is fabricated through the process steps described above.

Subsequently, the semiconductor device fixed to a second heatsink 25 will be described, as the semiconductor device fabricated in the above-described manner, with reference to FIG. 7A.

Figure 7A:
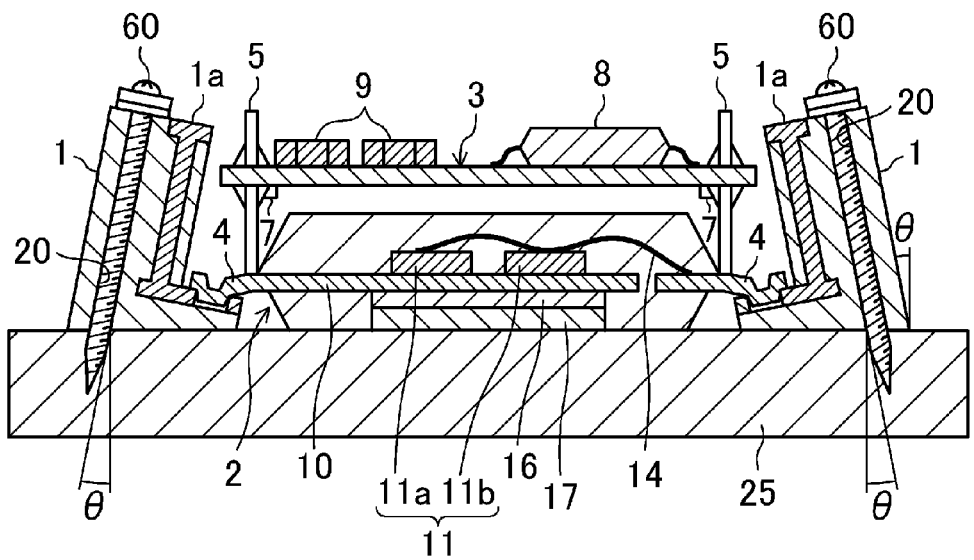
FIG. 7A is a schematic cross-sectional view illustrating a situation in which the semiconductor device according to the first embodiment is placed on the second heatsink.

As illustrated in FIG. 7A, the semiconductor device according to this embodiment includes the outer case 1 having two opposite sides each having a bottom surface inclined at the inclination angle θ. Thus, when the outer case 1 is fixed on the second heatsink 25 by a plurality of connection screws 60, opposite side surfaces of the outer case 1 are inclined inwardly at the inclination angle θ. As such, when the outer case 1 inclined at the inclination angle θ is fixed, the outer case 1 is inclined inwardly to allow the first heatsink 17 of the block module 2 to be in close contact with the second heatsink 25. In this case, the first through holes 20 of the outer case 1 are parallel to the side surfaces of the outer case 1, and the connection screws 60 are each inserted through a corresponding one of the first through holes 20 so as to be inclined at the inclination angle θ relative to the normal to an upper surface of the second heatsink 25. The bottom surface of the outer case 1 inclined at the inclination angle θ allows the side surfaces of the outer case 1, which are illustrated in FIG. 1, to be perpendicular to the bottom surface of the block module 2 before the fixing of the outer case 1 on the second heatsink 25. In contrast, the side surfaces of the outer case 1 fixed on the second heatsink 25 as illustrated in FIG. 7A are inclined at the inclination angle θ relative to the bottom surface of the block module 2, i.e., the top surface of the second heatsink 25.

In this embodiment, not only the inclination of the bottom surface of the outer case 1, but also the spring force of the lead frame 10 can further ensure close contact between the block module 2 and the second heatsink 25. The close contact between the block module 2 and the second heatsink 25 can increase heat dissipation from the block module 2 through the first heatsink 17 of the block module 2. In this embodiment, the close contact corresponds to an example condition of contact.

As such, unlike the conventional art, the semiconductor device according to this embodiment does not require a metal plate covering the entire bottom surface of the semiconductor device. This prevents variations in thickness of grease due to a warp in a metal plate. Furthermore, the semiconductor device according to this embodiment includes the first heatsink 17 placed in an lower portion of the block module 2, resulting in a reduction in the amount of the block module 2 itself warped. This can reduce the amount of increase in thermal resistance and variations in thermal resistance.

Here, the inclination angle θ which is illustrated in FIG. 1 and at which the bottom surface of the outer case 1 is inclined from the X plane toward a central portion of the block module 2 is preferably greater than or equal to 0.1° and equal to or less than 10° (0.1°≤θ≤10°). This range corresponds to the range of inclination angles in which fixing the outer case 1 by the connection screws 60 through the first through holes 20 as illustrated in FIG. 7A allows the lead frame 10 to generate an appropriate spring force. Specifically, when the inclination angle θ is less than 0.1°, the block module 2 cannot be pressed against the second heatsink 25 in the situation illustrated in FIG. 7A. Thus, the inclination angle θ is preferably greater than or equal to 0.1°. When the inclination angle θ is greater than or equal to 10°, the force applied to the lead frame 10 increases in the situation illustrated in FIG. 7A, and the lead frame 10 may be ruptured, or each main circuit terminal 4 and a corresponding one of the outer case terminals 1a may be disconnected from each other. Thus, the inclination angle θ is preferably equal to or less than 10°. To ensure that the block module 2 is pressed against the second heatsink 25, the inclination angle θ of the bottom surface of the outer case 1 is more preferably greater than or equal to 3°. Specifically, the inclination angle θ at which the outer case 1 is inclined toward the central portion of the block module 2 is more preferably greater than or equal to 3° and equal to or less than 10° (3°≤θ≤10°). In the situation illustrated in FIG. 6B, the difference D in height between the inner ends of the outer case 1 and the bottom surface of the block module 2 below the inner ends is preferably greater than or equal to 0.05 mm.

To fix the semiconductor device to the second heatsink 25, the connection screws 60, for example, are used to fix the semiconductor device through the first through holes 20 of the outer case 1 as described above. The second heatsink 25 is, for example, an aluminum (Al) heatsink.

Further advantages provided by the configuration of the semiconductor device according to this embodiment will now be described.

In the semiconductor device according to this embodiment, the utilization of the block module can reduce the amount of an encapsulation resin material used when transfer molding is performed using dies. Combining the lead frame 10 with the insulating layer 16 enables the replacement of an expensive ceramic substrate with an inexpensive material. As such, the structure of the semiconductor device according to this embodiment can sharply reduce the material cost.

In the semiconductor device according to this embodiment, the control terminals 5 drawn from the block module 2 are connected to the control substrate 3 immediately above the control terminals 5 (along the Z axis). This can sharply reduce the length of interconnects along lateral directions (along the X axis and the Y axis). This reduction can reduce the inductance of the semiconductor device, thereby reducing electrical damage caused to the semiconductor device by a surge voltage.

In a variation of the sequence of fabrication of the semiconductor device according to this embodiment, the control terminals 5 of the block module 2 may be previously joined to the control substrate 3 as illustrated in FIG. 6C before the block module 2 is placed in the outer case 1.

Figure 11:
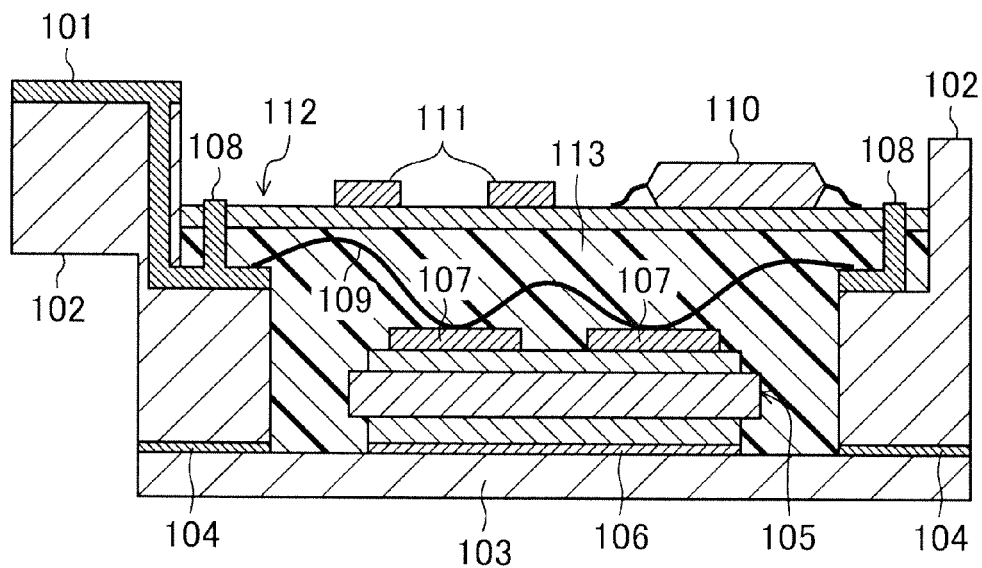
FIG. 11 is a schematic cross-sectional view illustrating a conventional semiconductor device.

In the semiconductor device according to this embodiment, the power semiconductor elements 11 are encapsulated with the resin material 15 of the block module 2, and as illustrated in FIG. 1, an airspace is, therefore, formed between the block module 2 and the control substrate 3. While the thermal conductivity of the silicone gel 113 for use in the conventional semiconductor device that was described with reference to FIG. 11 is higher than or equal to at least 1 W/(m·K), the thermal conductivity of air is about 0.02-0.03 W/(m·K). For this reason, in the semiconductor device according to this embodiment, the presence of the airspace can significantly reduce the heat transfer to the control substrate 3 as compared with the conventional semiconductor device.

In the semiconductor device according to this embodiment, each power semiconductor element 11 and corresponding ones of the outer case terminals 1a are joined together using the main circuit terminals 4 that are portions of the lead frame 10. Thus, the pattern of the lead frame 10 can easily increase the junction area (the cross-sectional junction area). Furthermore, if copper (Cu) having a thermal conductivity of 398 W/(m·K) is used as the material of the lead frame 10, heat can be about 1.7 times more easily transferred than when Al having a thermal conductivity of 237 W/(m·K) is used. Thus, the properties of Cu also help transfer heat. For this reason, in the semiconductor device according to this embodiment, the degree of heat transfer through a current path is much higher than in the conventional semiconductor device, and heat transferred to the control substrate 3 can be, therefore, reduced.

The control terminals 5 inserted through the through-holes of the control substrate 3 are portions of the lead frame 10 through which heat is more likely to be transferred in terms of the properties of the lead frame 10. On the other hand, the cross-sectional area of each control terminal 5 is previously reduced. This reduces heat transferred through the control terminal 5 to the control substrate 3. The control terminal 5 transmits only a control signal, and for this reason, even when the cross-sectional area of the control terminal 5 is equal to or less than one half of the cross-sectional area of each main circuit terminal 4, the control terminal 5 is not problematic in terms of electrical characteristics. Some of the Al wires 14 connected to the control terminals 5 in the block module 2 are preferably thinner than the other ones of the Al wires 14 joined to the main circuit terminals 4, because heat is less likely to be transferred.

In recent years, new power semiconductor elements including a new material, such as silicon carbide (SiC) or gallium nitride (GaN), instead of a conventional material, i.e., silicon (Si), have been becoming commercially practical. Such new power semiconductor elements can operate at a temperature exceeding 150-200° corresponding to conventional operating temperatures, and thus, have been expected to be downsized by simplifying the structures of heat dissipation mechanisms. The semiconductor device according to this embodiment is useful, in particular, when used for such a new power semiconductor element requiring heat control measures.

(Variation of First Embodiment)

Figure 7B:
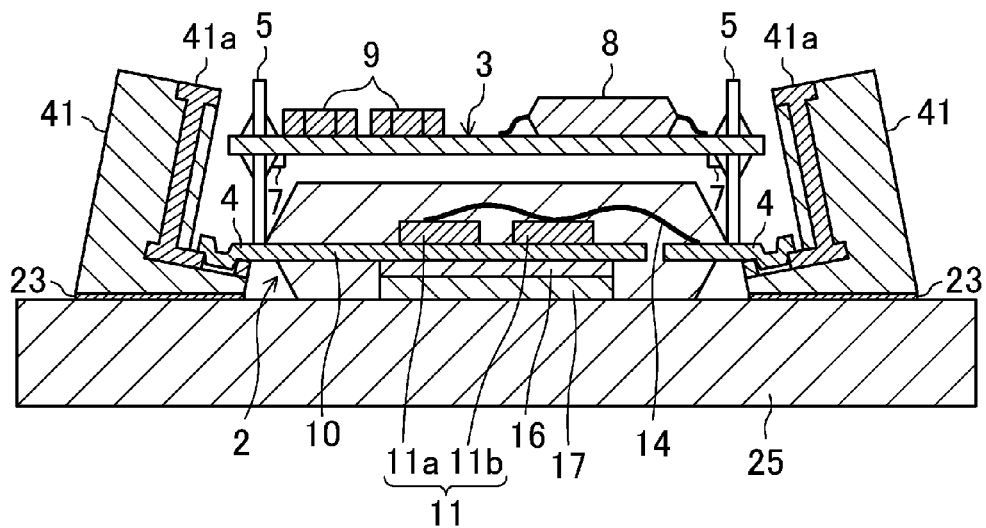
FIG. 7B is a schematic cross-sectional view illustrating a situation in which a semiconductor device according to a variation of the first embodiment is placed on a second heatsink.

FIG. 7B illustrates a semiconductor device according to a variation of the first embodiment. The semiconductor device includes an outer case 41 including outer case terminals 41a and fixed with an adhesive material. In the semiconductor device according to this variation, the outer case 41 is fixed to a second heatsink 25 with an adhesive instead of by connection screws. The semiconductor device according to this variation will be described with reference to FIG. 7B.

As illustrated in FIG. 7B, the semiconductor device according to this variation includes an adhesive 23 instead of connection screws 60 as a fixing member for fixing the outer case 41 to the second heatsink 25.

During the fabrication of the semiconductor device according to this variation, the adhesive 23 is previously applied to at least the inclined bottom surface of the outer case 41 in which a block module 2 is placed. Thereafter, the outer case 41 placed on a predetermined region of the second heatsink 25 is pressed against the second heatsink 25 by heat to allow a first heatsink 17 exposed from the bottom surface of the block module 2 to be in close contact with an upper surface of the second heatsink 25.

In this case, a thermosetting resin, for example, can be used as the adhesive 23.

(Second Embodiment)

Figure 8:
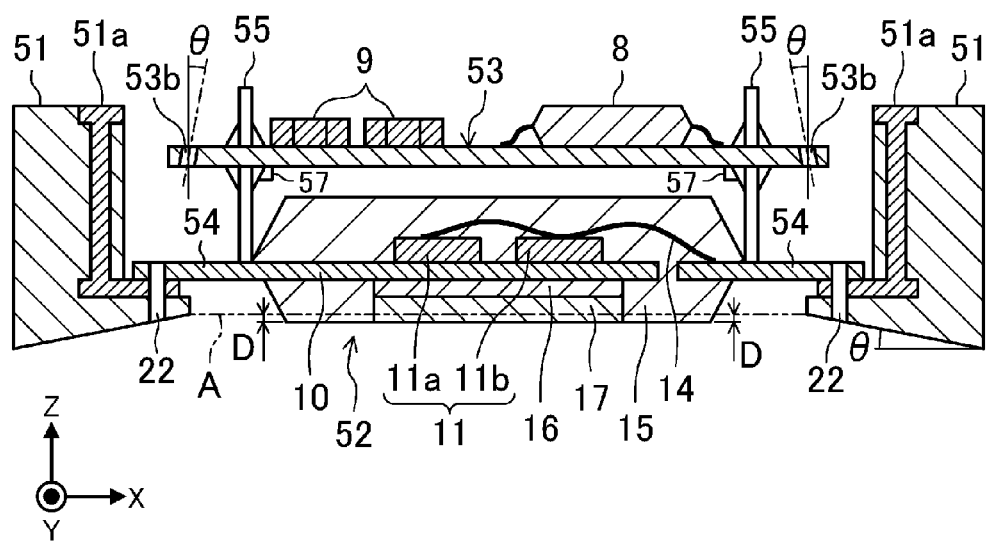
FIG. 8 is a schematic cross-sectional view illustrating an essential portion of a semiconductor device according to a second embodiment before the semiconductor device is placed on a second heatsink.

FIG. 8 is a schematic cross-sectional view of a semiconductor device according to a second embodiment of the present disclosure.

As illustrated in FIG. 8, the semiconductor device according to the second embodiment includes an outer case 51 into which, for example, a block module 52 is incorporated, and a control substrate 53 is placed immediately above the block module 52 (in a positive direction along the Z axis). The semiconductor device according to this embodiment can include the outer case 51 into which a plurality of block modules 2 are incorporated. The outer case 51 is an example package.

Figure 10:
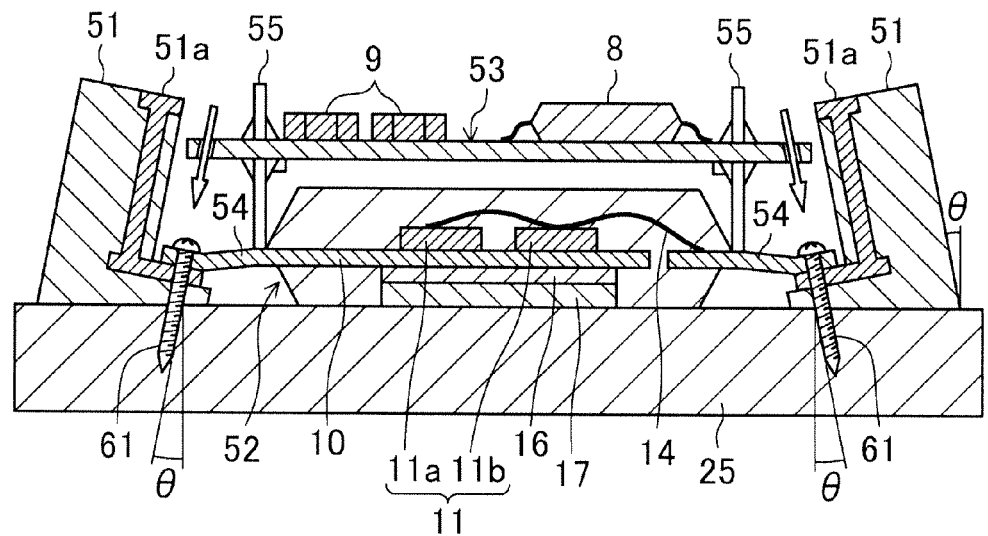
FIG. 10 is a schematic cross-sectional view illustrating a situation in which the semiconductor device according to the second embodiment is placed on the second heatsink.

Main circuit terminals 54 and control terminals 55 are drawn from the block module 52. The control terminals 55 each include a protrusion 57, and support the control substrate 53. The main circuit terminals 54 extend in lateral directions (along the X axis), and are each electrically connected to a corresponding one of outer case terminals 51a. As illustrated in FIG. 10, each main circuit terminal 54 is electrically connected to the corresponding one of the outer case terminals 51a by a connection screw 61 inserted through a screw through hole 22 formed in both of the main circuit terminal 54 and the corresponding one of the outer case terminals 51a. The connection screw 61 is also a member for fixing the outer case 51 and the block module 52 to a second heatsink 25. The control terminals 55 are drawn in a direction perpendicular to the main circuit terminals 54 (in a positive direction along the Z axis), and are inserted through through-holes (not shown) of the control substrate 53. In this case, the control terminals 55 are electrically joined to the control substrate 53 by, for example, soldering.

The control substrate 53 has a plurality of through holes 53b that are each inclined at an inclination angle $\theta$. The through holes 53b are each formed to pass the connection screw 61 therethrough when a corresponding one of the main circuit terminals 54 and a corresponding one of the outer case terminals 51a are screwed. The reason why the through holes 53b are inclined at the inclination angle $\theta$ is that when the connection screw 61 is passed through a corresponding one of the through holes 53b, the inclination angle $\theta$ at which the bottom surface of the outer case 51 is inclined allows the screw through holes 22 to be inclined at the angle $\theta$.

A peripheral portion of the control substrate 53 can have through holes or cutouts, and the connection screws 61 can be each inserted through a corresponding one of the through holes or a corresponding one of the cutouts to connect a corresponding one of the main circuit terminals 54 to a corresponding one of the outer case terminals 51a. If the control substrate 53 has the through holes or cutouts, the control substrate 53 is fixed to the second heatsink 25 with the outer case 51 inclined. This may cause the control substrate 53 to be caught in the outer case 51, resulting in a warp in the control substrate 53. For this reason, in particular, when the semiconductor device is to be reduced in size, the size of the control substrate 53 is preferably reduced such that the control substrate 53 is located inwardly from portions of the main circuit terminals 54 and portions of the outer case terminals 51a connected using the connection screws 61 without forming through holes or cutouts.

A method for fabricating a semiconductor device according to this embodiment will be described with reference to FIGS. 9A-9C.

Figure 9A:
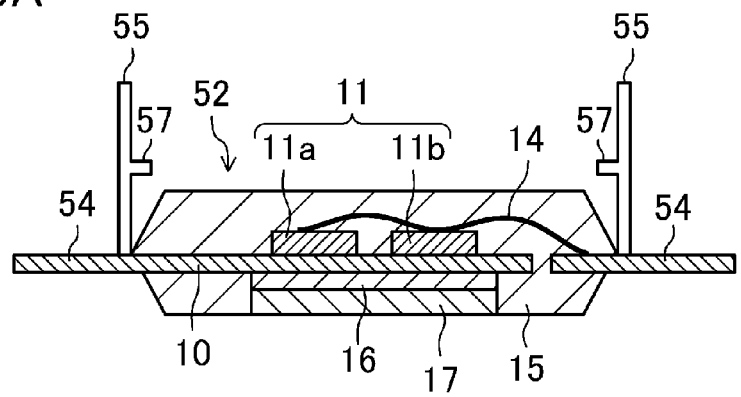
FIGS. 9A-9C are schematic cross-sectional views sequentially illustrating essential process steps in a method for fabricating a semiconductor device according to the second embodiment.

First, as illustrated in FIG. 9A, a block module 52 including a plurality of power semiconductor elements 11 is fabricated.

Figure 9B:
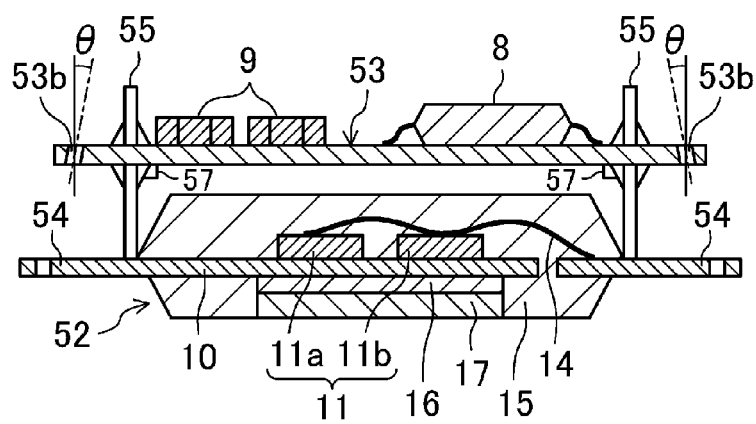

Next, as illustrated in FIG. 9B, a control substrate 53 is joined to control terminals 55 of the block module 52. In this case, an airspace is formed between the control substrate 53 and the block module 52.

Figure 9C:
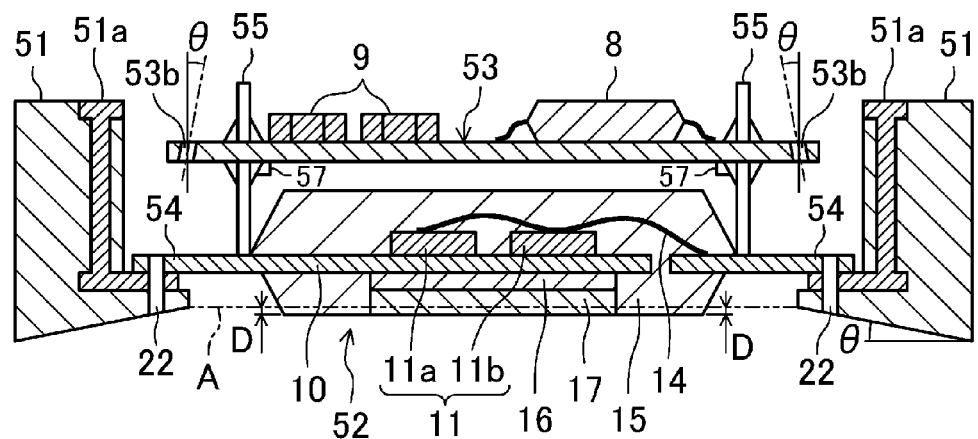

Next, as illustrated in FIG. 9C, screw through holes 22 of the block module 52 joined to the control substrate 53 are each aligned with a corresponding one of the screw through holes 22 of the outer case 51. Thereafter, as illustrated in FIG. 10, the outer case 51 and the second heatsink 25 are electrically connected together by connection screws 61, and are fixed.

In this embodiment, the screw through holes 22 of the outer case 51 are parallel to side surfaces of the outer case 51. Thus, the connection screws 61 are inserted through the screw through holes 22 while being inclined at an inclination angle $\theta$ relative to the normal to an upper surface of the second heatsink 25. The inclination of the bottom surface of the outer case 51 at the inclination angle $\theta$ allows the side surfaces of the outer case 51 illustrated in FIG. 8 to be perpendicular to a lower surface of the block module 52 before the outer case 51 is fixed to the second heatsink 25. In contrast, the side surfaces of the outer case 51 illustrated in FIG. 10 and fixed to the second heatsink 25 are inclined at the inclination angle $\theta$ relative to the lower surface of the block module 52, i.e., the upper surface of the second heatsink 25.

Unlike the fabrication method illustrated in FIGS. 9A-9C, the control terminals 55 of the block module 52 may be joined to the control substrate 53 after the block module 52 is placed in the outer case 51.

In this embodiment, unlike the first embodiment described above, a caulking process step can be eliminated, thereby reducing the time period during which process steps are performed.

The semiconductor devices according to the first and second embodiments are each easily disassembled into the outer case, the block module, and the control substrate by unscrewing the connection screws, and are easily recycled.

INDUSTRIAL APPLICABILITY

A semiconductor device according to the present disclosure and a method for fabricating the same can be utilized for, for example, power devices used in the form of power conditioners of photovoltaic power generation systems and power devices used to control and the rotation of a motor.

DESCRIPTION OF REFERENCE CHARACTERS

A, B VIRTUAL LINE
1, 41, 51 OUTER CASE
1a, 41a, 51a OUTER CASE TERMINAL
2, 52 BLOCK MODULE
3, 53 CONTROL SUBSTRATE
4, 54 MAIN CIRCUIT TERMINAL
5, 55 CONTROL TERMINAL
7, 57 PROTRUSION
8 CONTROL ELEMENT
9 PASSIVE COMPONENT
10 LEAD FRAME
11 POWER SEMICONDUCTOR ELEMENT
11a IGBT
11b DIODE
12 SOURCE ELECTRODE
13 GATE ELECTRODE
14 Al WIRE
15 RESIN MATERIAL
16 INSULATING LAYER
17 FIRST HEATSINK
20 FIRST THROUGH HOLE
21 CAULKED PORTION
22 SCREW THROUGH HOLE
23 ADHESIVE
25 SECOND HEATSINK
53b THROUGH HOLE
60, 61 CONNECTION SCREW

The invention claimed is:

1. A semiconductor device comprising:
a block module which internally includes a power semiconductor element and a first heatsink, and from which a main circuit terminal and a control terminal are drawn;
a control substrate connected to the control terminal;
a package in which the block module and the control substrate are housed; and
a second heatsink to which the package is fixed by a connection screw, wherein
the connection screw is inserted into the second heatsink so as to be inclined at an inclination angle $\theta$ relative to a normal to a surface of the second heatsink,
the main circuit terminal is fixed to a connection terminal of the package,
if the package has not been fixed to the second heatsink, a bottom surface of the package is inclined upwardly at an angle $\theta$ from an outside of the package toward an inside of the package,
if the package has been fixed to the second heatsink, the surface of the package inclined if the package has not been fixed to the second heatsink is in contact with the second heatsink, and
a bottom surface of the block module and a surface of the second heatsink are in direct contact with each other, and under a biasing force to maintain contact.

2. The semiconductor device of claim 1, wherein the connection screw allows the first and second heatsinks to be in close contact with each other.

3. The semiconductor device of claim 1, wherein
the package is rectangular as viewed from above, and
the package is fixed at each of two opposite ones of four sides of the package by the connection screw.

4. The semiconductor device of claim 1, wherein the package is fixed such that a side surface of the package is inclined at the inclination angle $\theta$ relative to the normal to the surface of the second heatsink.

5. The semiconductor device of claim 1, wherein
when the package is not fixed to the second heatsink, a virtual line connecting opposite inner ends of the inclined surface of the package passes through an interior of the first heatsink of the block module.

6. The semiconductor device of claim 1, wherein the inclination angle $\theta$ is greater than or equal to 3° and equal to or less than 10°.

7. The semiconductor device of claim 1, wherein the package is fixed to the second heatsink by the connection screw through a through-hole formed in the package.

8. The semiconductor device of claim 1, wherein the main circuit terminal of the block module and a connection terminal of the package are joined together by caulking.

9. The semiconductor device of claim 1, wherein the package is fixed to the second heatsink by the connection screw through a through-hole formed in the main circuit terminal and a through-hole formed in the connection terminal of the package.

10. A semiconductor device comprising:
a block module which internally includes a power semiconductor element and a first heatsink, and from which a main circuit terminal and a control terminal are drawn;
a control substrate connected to the control terminal;
a package in which the block module and the control substrate are housed; and
a second heatsink to which the package is fixed, wherein
when the first and second heatsinks are arranged in parallel,
a surface of the package is inclined at an inclination angle $\theta$ relative to a surface of the second heatsink in a situation where the package is not fixed to the second heatsink, and
the surface of the package is parallel to the surface of the second heatsink in a situation where the package is fixed to the second heatsink,
the main circuit terminal is fixed to a connection terminal of the package,
if the package has not been fixed to the second heatsink, a bottom surface of the package is inclined upwardly at an angle $\theta$ from an outside of the package toward an inside of the package,
if the package has been fixed to the second heatsink, the surface of the package inclined if the package has not been fixed to the second heatsink is in contact with the second heatsink, and a bottom surface of the block module and a surface of the second heatsink are in direct contact with each other, and under a biasing force to maintain contact.

11. A method for fabricating a semiconductor device, the method comprising:
preparing a block module which internally includes a power semiconductor element and a first heatsink, and from which a main circuit terminal and a control terminal are drawn, a control substrate connected to the control terminal, and a package in which the block module and the control substrate are housed and which includes a connection terminal joined to the main circuit terminal; and
fixing the package having a surface inclined at an inclination angle θ to a second heatsink by a connection screw inserted into the second heatsink at the inclination angle θ relative to a normal to a surface of the second heatsink, wherein
if the package has not been fixed to the second heatsink, a bottom surface of the package is inclined upwardly at an angle θ from an outside of the package toward an inside of the package,
if the package has been fixed to the second heatsink, the surface of the package inclined if the package has not been fixed to the second heatsink is in contact with the second heatsink, and
a bottom surface of the block module and a surface of the second heatsink are in direct contact with each other, and under a biasing force to maintain contact.

12. The method of claim 11, wherein
the package is rectangular as viewed from above, and
the package is fixed at each of two opposite ones of four sides of the package by the connection screws.

13. The method of claim 11, wherein before the package is fixed to the second heatsink, a virtual line connecting opposite inner ends of the inclined surface of the package passes through an interior of the first heatsink of the block module.

14. The method of claim 11, wherein the inclination angle θ is greater than or equal to 3° and equal to or less than 10°.

15. The method of claim 11, wherein the package is fixed to the second heatsink by the connection screw through a through-hole formed in the main circuit terminal and a through-hole formed in the connection terminal of the package.

* * * * *